(12) United States Patent
Pax et al.

(10) Patent No.: US 7,746,095 B2
(45) Date of Patent: *Jun. 29, 2010

(54) MEMORY MODULE AND METHOD HAVING IMPROVED SIGNAL ROUTING TOPOLOGY

(75) Inventors: George E. Pax, Boise, ID (US); Roy E. Greeff, Boise, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/480,589

(22) Filed: Jun. 8, 2009

(65) Prior Publication Data

US 2009/0243649 A1 Oct. 1, 2009

Related U.S. Application Data

(60) Continuation of application No. 11/973,684, filed on Oct. 9, 2007, now Pat. No. 7,557,601, which is a continuation of application No. 11/238,900, filed on Sep. 28, 2005, now Pat. No. 7,282,947, which is a division of application No. 10/932,477, filed on Sep. 1, 2004, now Pat. No. 7,242,213, which is a continuation of application No. 10/460,588, filed on Jun. 11, 2003, now Pat. No. 7,245,145.

(51) Int. Cl.
*H03K 19/003* (2006.01)
(52) U.S. Cl. ........................................ 326/21; 711/118
(58) Field of Classification Search ............. 326/21–30; 711/118, 170
See application file for complete search history.

(56) References Cited

U.S. PATENT DOCUMENTS 3,777,154 A 12/1973 Lindsey ..................... 250/227

(Continued)

FOREIGN PATENT DOCUMENTS

EP 0849685 A2 6/1998

(Continued)

OTHER PUBLICATIONS

Scott, Noel D. et al., "An Overview of the Visualize fx Graphics Accelerator Hardware," The Hewlett-Packard Journal, Article 4, May 1998, pp. 28-34.

(Continued)

*Primary Examiner*—Lam T Mai
(74) *Attorney, Agent, or Firm*—Lerner, David, Littenberg, Krumholz & Mentlik, LLP

(57) ABSTRACT

A registered memory module includes several memory devices coupled to a register through a plurality of transmission lines forming a symmetrical tree topology. The tree includes several branches each of which includes two transmission lines coupled only at its ends to either another transmission line or one of the memory devices. The branches are arranged in several layers of hierarchy, with the transmission lines in branches having the same hierarchy having the same length. Each transmission line preferably has a characteristic impedance that is half the characteristic impedance of any pair of downstream transmission lines to which it is coupled to provide impedance matching. A dedicated transmission line is used to couple an additional memory device, which may or may not be an error checking memory device, to the register.

24 Claims, 3 Drawing Sheets

U.S. PATENT DOCUMENTS

| | | | |
|---|---|---|---|
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,443,845 A | 4/1984 | Hamilton et al. | 364/200 |
| 4,608,702 A | 8/1986 | Hirzel et al. | 375/110 |
| 4,707,823 A | 11/1987 | Holdren et al. | 370/1 |
| 4,724,520 A | 2/1988 | Athanas et al. | 364/200 |
| 4,809,232 A | 2/1989 | Baumbaugh et al. | 365/221 |
| 4,813,772 A | 3/1989 | Kowel et al. | 350/388 |
| 4,823,403 A | 4/1989 | Twietmeyer | 455/607 |
| 4,825,208 A | 4/1989 | Mueller et al. | 340/825.02 |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,307,381 A | 4/1994 | Ahuja | 375/107 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,379,382 A | 1/1995 | Work et al. | 395/275 |
| 5,414,819 A | 5/1995 | Redmond et al. | 395/325 |
| 5,423,009 A | 6/1995 | Zhu | 395/325 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,493,437 A | 2/1996 | Lebby et al. | 359/152 |
| 5,497,476 A | 3/1996 | Oldfield et al. | 395/439 |
| 5,502,621 A | 3/1996 | Schumacher et al. | 361/760 |
| 5,532,856 A | 7/1996 | Li et al. | 359/118 |
| 5,544,319 A | 8/1996 | Acton et al. | 395/200.07 |
| 5,544,345 A | 8/1996 | Carpenter et al. | 395/477 |
| 5,566,325 A | 10/1996 | Bruce, II et al. | 395/494 |
| 5,568,574 A | 10/1996 | Tanguay, Jr. et al. | 385/14 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,608,264 A | 3/1997 | Gaul | 357/734 |
| 5,623,534 A | 4/1997 | Desai et al. | 379/59 |
| 5,638,334 A | 6/1997 | Farmwald et al. | 365/230.03 |
| 5,638,534 A | 6/1997 | Mote, Jr. | 395/485 |
| 5,659,798 A | 8/1997 | Blumrich et al. | 395/846 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,787,475 A | 7/1998 | Pawlowski | 711/137 |
| 5,796,413 A | 8/1998 | Shipp et al. | 345/522 |
| 5,808,897 A | 9/1998 | Miller, Jr. et al. | 364/490 |
| 5,818,844 A | 10/1998 | Singh et al. | 370/463 |
| 5,818,984 A | 10/1998 | Ahmad et al. | 385/14 |
| 5,819,304 A | 10/1998 | Nilsen et al. | 711/5 |
| 5,822,255 A | 10/1998 | Uchida | 365/194 |
| 5,831,467 A * | 11/1998 | Leung et al. | 327/319 |
| 5,832,250 A | 11/1998 | Whittaker | 395/471 |
| 5,872,944 A | 2/1999 | Goldrian et al. | 395/306 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,026,226 A | 2/2000 | Heile et al. | 395/500.13 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,078,451 A | 6/2000 | Ioki | 360/51 |
| 6,079,008 A | 6/2000 | Clery, III | 712/11 |
| 6,088,774 A | 7/2000 | Gillingham | 711/167 |
| 6,092,158 A | 7/2000 | Harriman et al. | 711/151 |
| 6,098,158 A | 8/2000 | Lay et al. | 711/162 |
| 6,101,151 A | 8/2000 | Watanabe et al. | 365/233 |
| 6,105,075 A | 8/2000 | Ghaffari | 710/5 |
| 6,105,088 A | 8/2000 | Pascale et al. | 710/100 |
| 6,111,757 A | 8/2000 | Dell et al. | 361/737 |
| 6,125,431 A | 9/2000 | Kobayashi | 711/154 |
| 6,128,703 A | 10/2000 | Bourekas et al. | 711/138 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,327 A | 11/2000 | Distinti et al. | 341/126 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,219,725 B1 | 4/2001 | Diehl et al. | 710/26 |
| 6,223,301 B1 | 4/2001 | Santeler et al. | 714/6 |
| 6,226,729 B1 | 5/2001 | Stevens et al. | 711/171 |
| 6,229,712 B1 | 5/2001 | Munoz-Bustamante et al. | 361/783 |
| 6,229,727 B1 | 5/2001 | Doyle | 365/63 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,253 B1 | 7/2001 | Oberlaender et al. | 365/230.02 |
| 6,256,692 B1 | 7/2001 | Yoda et al. | 710/104 |
| 6,266,730 B1 | 7/2001 | Perino et al. | 710/126 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,343,171 B1 | 1/2002 | Yoshimura et al. | 385/50 |
| 6,344,664 B1 | 2/2002 | Trezza et al. | 257/82 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,366,375 B1 | 4/2002 | Sakai et al. | 359/115 |
| 6,366,529 B1 | 4/2002 | Williams et al. | 365/239 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |

| Patent No. | Date | Inventor | Class |
|---|---|---|---|
| 6,392,653 B1 | 5/2002 | Malandain et al. | 345/501 |
| 6,401,213 B1 | 6/2002 | Jeddeloh | 713/401 |
| 6,405,273 B1 | 6/2002 | Fleck et al. | 710/131 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,433,785 B1 | 8/2002 | Garcia et al. | 345/531 |
| 6,434,639 B1 | 8/2002 | Haghighi | 710/39 |
| 6,434,654 B1 | 8/2002 | Story et al. | 710/307 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,377 B1 | 9/2002 | Farnworth et al. | 710/300 |
| 6,453,393 B1 | 9/2002 | Holman et al. | 711/154 |
| 6,457,116 B1 | 9/2002 | Mirsky et al. | 712/16 |
| 6,460,114 B1 | 10/2002 | Jeddeloh | 711/120 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,490,188 B2 | 12/2002 | Nuxoll et al. | 365/63 |
| 6,493,784 B1 | 12/2002 | Kamimura et al. | 710/309 |
| 6,493,803 B1 | 12/2002 | Pham et al. | 711/147 |
| 6,496,193 B1 | 12/2002 | Surti et al. | 345/552 |
| 6,496,909 B1 | 12/2002 | Schimmel | 711/163 |
| 6,501,471 B1 | 12/2002 | Venkataraman et al. | 345/424 |
| 6,502,161 B1 | 12/2002 | Perego et al. | 711/5 |
| 6,505,287 B2 | 1/2003 | Uematsu | 711/170 |
| 6,507,899 B1 | 1/2003 | Oberlaender et al. | 711/169 |
| 6,523,092 B1 | 2/2003 | Fanning | 711/134 |
| 6,523,093 B1 | 2/2003 | Bogin et al. | 711/137 |
| 6,526,483 B1 | 2/2003 | Cho et al. | 711/154 |
| 6,526,498 B1 | 2/2003 | Mirsky et al. | 712/11 |
| 6,539,490 B1 | 3/2003 | Forbes et al. | 713/401 |
| 6,552,304 B1 | 4/2003 | Hirose et al. | 219/216 |
| 6,552,564 B1 | 4/2003 | Forbes et al. | 326/30 |
| 6,553,479 B2 | 4/2003 | Mirsky et al. | 712/16 |
| 6,564,329 B1 | 5/2003 | Cheung et al. | 713/322 |
| 6,567,963 B1 | 5/2003 | Trezza | 716/8 |
| 6,570,429 B1 | 5/2003 | Hellriegel | 327/295 |
| 6,584,543 B2 | 6/2003 | Williams et al. | 711/105 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,599,031 B2 | 7/2003 | Li | 385/88 |
| 6,615,325 B2 | 9/2003 | Mailloux et al. | 711/154 |
| 6,622,227 B2 | 9/2003 | Zumkehr et al. | 711/167 |
| 6,623,177 B1 | 9/2003 | Chilton | 385/88 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,636,957 B2 | 10/2003 | Stevens et al. | 711/171 |
| 6,646,929 B1 | 11/2003 | Moss et al. | 365/194 |
| 6,647,470 B1 | 11/2003 | Janzen | 711/154 |
| 6,651,139 B1 | 11/2003 | Ozeki et al. | 711/118 |
| 6,658,509 B1 | 12/2003 | Bonella et al. | 710/100 |
| 6,661,940 B2 | 12/2003 | Kim | 385/15 |
| 6,661,943 B2 | 12/2003 | Li | 385/18 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,681,292 B2 | 1/2004 | Creta et al. | 711/119 |
| 6,681,301 B1 | 1/2004 | Mehta et al. | 711/154 |
| 6,697,926 B2 | 2/2004 | Johnson et al. | 711/167 |
| 6,707,726 B2 | 3/2004 | Nishio et al. | 365/189.12 |
| 6,711,652 B2 | 3/2004 | Arimilli et al. | 711/141 |
| 6,715,018 B2 | 3/2004 | Farnworth et al. | 710/300 |
| 6,718,440 B2 | 4/2004 | Maiyuran et al. | 711/137 |
| 6,721,187 B2 | 4/2004 | Hall et al. | 361/760 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,113 B2 | 6/2004 | Bhakta et al. | 365/63 |
| 6,751,703 B2 | 6/2004 | Chilton | 711/113 |
| 6,751,722 B2 | 6/2004 | Mirsky et al. | 712/15 |
| 6,752,539 B2 | 6/2004 | Colgan et al. | 385/92 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,772,261 B1 | 8/2004 | D'Antonio et al. | 710/301 |
| 6,775,747 B2 | 8/2004 | Venkatraman | 711/137 |
| 6,785,780 B1 | 8/2004 | Klein et al. | 711/148 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,793,408 B2 | 9/2004 | Levy et al. | 385/88 |
| 6,793,411 B2 | 9/2004 | Seifert | 385/92 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,931 B2 | 11/2004 | Shih | 710/62 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,829,398 B2 | 12/2004 | Ouchi | 385/14 |
| 6,845,409 B1 | 1/2005 | Talagala et al. | 710/20 |
| 6,889,304 B2 | 5/2005 | Perego et al. | 711/170 |
| 6,910,109 B2 | 6/2005 | Holman et al. | 711/156 |
| 6,910,812 B2 | 6/2005 | Pommer et al. | 385/92 |
| 6,949,406 B2 | 9/2005 | Bosnyak et al. | 438/106 |
| 6,950,956 B2 | 9/2005 | Zerbe et al. | 713/400 |
| 6,956,996 B2 | 10/2005 | Gordon et al. | 385/48 |
| 6,961,259 B2 | 11/2005 | Lee et al. | 365/63 |
| 6,961,834 B2 | 11/2005 | Weber | 711/169 |
| 6,980,748 B2 | 12/2005 | Leas | 398/202 |
| 6,982,892 B2 | 1/2006 | Lee et al. | 365/63 |
| 7,000,062 B2 | 2/2006 | Perego et al. | 711/5 |
| 7,016,213 B2 | 3/2006 | Reeves et al. | 365/63 |
| 7,016,606 B2 | 3/2006 | Cai et al. | 398/27 |
| 7,024,547 B2 | 4/2006 | Kartoz | 713/1 |
| 7,035,212 B1 | 4/2006 | Mittal et al. | 370/230 |
| 7,062,595 B2 | 6/2006 | Lindsay et al. | 710/315 |
| 7,102,907 B2 | 9/2006 | Lee et al. | 365/63 |
| 7,106,611 B2 | 9/2006 | Lee et al. | 365/200 |
| 7,106,973 B2 | 9/2006 | Kube et al. | 398/164 |
| 7,120,723 B2 | 10/2006 | Jeddeloh | 710/311 |
| 7,120,743 B2 | 10/2006 | Meyer et al. | 711/118 |
| 7,136,953 B1 | 11/2006 | Bisson et al. | 710/307 |
| 7,171,508 B2 | 1/2007 | Choi | 710/307 |
| 7,181,584 B2 | 2/2007 | LaBerge | 711/167 |
| 7,200,024 B2 | 4/2007 | Taylor | 365/64 |
| 7,222,213 B2 | 5/2007 | James | 711/5 |
| 7,234,070 B2 | 6/2007 | James | 713/503 |
| 7,242,213 B2 * | 7/2007 | Pax et al. | 326/30 |
| 7,245,145 B2 * | 7/2007 | Pax et al. | 326/30 |
| 7,254,331 B2 | 8/2007 | Murphy | 398/70 |
| 7,282,947 B2 * | 10/2007 | Pax et al. | 326/21 |

| | | | |
|---|---|---|---|
| 7,557,601 B2* | 7/2009 | Pax et al. .................. 326/21 |
| 2001/0023474 A1 | 9/2001 | Kyozuka et al. ............ 711/114 |
| 2001/0034839 A1 | 10/2001 | Karjoth et al. .............. 713/190 |
| 2001/0039612 A1 | 11/2001 | Lee ............................... 713/2 |
| 2002/0038412 A1 | 3/2002 | Nizar et al. ................. 711/170 |
| 2002/0042863 A1 | 4/2002 | Jeddeloh ..................... 711/143 |
| 2002/0112119 A1 | 8/2002 | Halbert et al. .............. 711/115 |
| 2002/0116588 A1 | 8/2002 | Beckert et al. .............. 711/161 |
| 2002/0144064 A1 | 10/2002 | Fanning ...................... 711/144 |
| 2002/0178319 A1 | 11/2002 | Sanchez-Olea ............. 710/305 |
| 2003/0005223 A1 | 1/2003 | Coulson et al. ............. 711/118 |
| 2003/0043158 A1 | 3/2003 | Wasserman et al. ......... 345/545 |
| 2003/0043426 A1 | 3/2003 | Baker et al. ................. 359/109 |
| 2003/0093630 A1 | 5/2003 | Richard et al. .............. 711/154 |
| 2003/0149809 A1 | 8/2003 | Jensen et al. .................. 710/22 |
| 2003/0163649 A1 | 8/2003 | Kapur et al. ................. 711/146 |
| 2003/0177320 A1 | 9/2003 | Sah et al. ..................... 711/158 |
| 2003/0193927 A1 | 10/2003 | Hronik ........................ 370/351 |
| 2003/0217223 A1 | 11/2003 | Nino, Jr. et al. ............. 711/105 |
| 2003/0227798 A1 | 12/2003 | Pax ......................... 365/189.12 |
| 2003/0229734 A1 | 12/2003 | Chang et al. .................. 710/36 |
| 2003/0229762 A1 | 12/2003 | Maiyuran et al. ........... 711/137 |
| 2003/0229770 A1 | 12/2003 | Jeddeloh ..................... 711/213 |
| 2004/0022094 A1 | 2/2004 | Radhakrishnan et al. .... 365/200 |
| 2004/0044833 A1 | 3/2004 | Ryan ............................... 711/5 |
| 2004/0064602 A1 | 4/2004 | George ........................ 710/22 |
| 2004/0123088 A1 | 6/2004 | Poisner et al. .................. 713/1 |
| 2004/0126115 A1 | 7/2004 | Levy et al. ................... 398/116 |
| 2004/0128421 A1 | 7/2004 | Forbes ........................ 710/303 |
| 2004/0144994 A1 | 7/2004 | Lee et al. ..................... 257/200 |
| 2004/0148482 A1 | 7/2004 | Grundy et al. ............... 711/167 |
| 2004/0230718 A1 | 11/2004 | Polzin et al. .................. 710/22 |
| 2004/0236885 A1 | 11/2004 | Fredriksson et al. ........ 710/100 |
| 2004/0268009 A1 | 12/2004 | Shin et al. ................... 710/310 |
| 2005/0044327 A1 | 2/2005 | Howard et al. .............. 711/147 |
| 2005/0071542 A1 | 3/2005 | Weber et al. ................ 711/105 |
| 2005/0105350 A1 | 5/2005 | Zimmerman ................ 365/201 |
| 2005/0146946 A1 | 7/2005 | Taylor ................... 365/189.05 |
| 2005/0162882 A1 | 7/2005 | Reeves et al. ................ 365/63 |
| 2005/0210216 A1 | 9/2005 | Jobs et al. .................... 711/170 |
| 2005/0228939 A1 | 10/2005 | Janzen ........................ 711/105 |
| 2006/0023528 A1 | 2/2006 | Pax et al. ..................... 365/202 |
| 2006/0047891 A1 | 3/2006 | James et al. ................. 711/105 |
| 2006/0179203 A1 | 8/2006 | Jeddeloh ..................... 710/311 |
| 2006/0179208 A1 | 8/2006 | Jeddeloh ..................... 711/100 |
| 2006/0195647 A1 | 8/2006 | Jeddeloh ..................... 711/100 |
| 2006/0200598 A1 | 9/2006 | Janzen ........................ 710/58 |
| 2006/0204247 A1 | 9/2006 | Murphy ...................... 398/139 |
| 2006/0206667 A1 | 9/2006 | Ryan ........................... 711/115 |
| 2006/0206742 A1 | 9/2006 | James ........................ 713/503 |
| 2006/0218331 A1 | 9/2006 | James ........................ 710/305 |
| 2006/0271720 A1 | 11/2006 | James et al. ................. 710/306 |
| 2007/0025133 A1 | 2/2007 | Taylor ........................... 365/63 |
| 2007/0035980 A1 | 2/2007 | Taylor ........................... 365/63 |
| 2007/0143553 A1 | 6/2007 | LaBerge ..................... 711/154 |
| 2007/0168595 A1 | 7/2007 | Jeddeloh ..................... 710/311 |
| 2008/0162861 A1 | 7/2008 | Jobs et al. ................... 711/170 |

FOREIGN PATENT DOCUMENTS

| | | |
|---|---|---|
| GB | 2288066 A | 10/1995 |
| JP | 2001265539 A | 9/2001 |
| WO | WO 93/19422 | 9/1993 |
| WO | WO 02/27499 A2 | 4/2000 |

OTHER PUBLICATIONS

Clugston, Mike, Definition of "cache", 2004, www.xreferplus.com.

Depari, A. et al., "*USB Sensor Network For Industrial Applications*", IEEE XPLORE, May 2004 (Abstract Only).

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

Gillett, R. et al., "*Using The Memory Channel Network*", Micro IEEE, vol. 17, Issue 1, Jan.-Feb. 1997 (Abstract Only).

Gillingham, Peter, "*SLDRAM Architectural and Functional Overview*", 1997 SLDRAM Consortium, Aug. 29, 1997, pp. 1-14.

Gommans et al., "*Applications Drive Secure Lightpath Creation Across Heterogeneous Domains*", Communications Magazine, IEEE, vol. 44, Issue 3, Mar. 2006 (Abstract Only).

Hsieh et al., "*On The Design Of A Local Switch for Heterogenous Multi-subsystem Interconnected*", IEEE XPLORE, Oct. 1993 (Abstract Only).

Intel, "Flash Memory PCI Add-In Card for Embedded Systems", Application Note AP-758, Sep., 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Omkar et al., "*Neural Network Controller for Minimizing Hub Shear Forces in Helicopter*", IEEE XPLORE, Sep. 1998 (Abstract Only).

Shanley, T. et al., "PCI System Architecture", Third Edition, Mindshare, Inc., 1995, pp. 24-25.

* cited by examiner

MEMORY MODULE AND METHOD HAVING IMPROVED SIGNAL ROUTING TOPOLOGY

CROSS-REFERENCE TO RELATED APPLICATIONS

This application is a continuation of U.S. patent application Ser. No. 11/973,684, filed Oct. 9, 2007, which is a continuation of U.S. patent application Ser. No. 11/238,900, filed Sep. 28, 2005, U.S. Pat. No. 7,282,947, which is a divisional of U.S. patent application Ser. No. 10/932,477, filed Sep. 1, 2004, U.S. Pat. No. 7,242,213, which is a continuation of U.S. patent application Ser. No. 10/460,588, filed Jun. 11, 2003, U.S. Pat. No. 7,245,145. These applications are incorporated by reference herein.

TECHNICAL FIELD

The present invention relates to memory systems, and, more particularly, to memory modules having transmission lines coupled to a large number of memory devices.

BACKGROUND OF THE INVENTION

Memory devices are in widespread use in a variety of processor-based systems, such as computer systems. In some cases, memory devices can be mounted on the same circuit board as a processor and a memory controller, which is generally used to couple the memory devices to the processor. However, in most cases, the memory devices are part of a memory module in which several memory devices are mounted on a common substrate, such as a printed circuit board. The memory modules are generally plugged into sockets mounted on a motherboard to establish communication with a memory controller and processor. Such memory modules are commonly used in computer systems as system memory in which the memory modules are dynamic random access memory ("DRAMs") devices.

Although the memory devices in a memory module may be coupled directly to a memory controller, in one type of memory module, known as a "registered" memory module, the memory devices are coupled to a register that is, in turn, coupled to the memory controller. More specifically, in a registered DRAM module, the command and address lines from the memory controller are coupled to a register. The register stores memory commands and addresses coupled through the command and address lines, respectively, and then couples the commands and addresses to the memory devices. Data signals are typically coupled directly to and from the memory devices without being registered. By registering the command and address signals, they can be coupled to the memory module for a relatively short period of time since it is not necessary to wait for the memory devices to latch the command and address signals. Also, registering the command and address signals avoids excessive loading of the command and address lines because the command and address lines are coupled to only a single device, i.e., the register, rather than to multiple devices, i.e., all of the memory devices.

The manner in which each of the command and address lines are routed from the register to the memory devices can significantly affect the performance of the memory module. One coupling topology, known as a "daisy chain" topology, is shown in FIG. 1A. In a daisy chain topology, a first transmission line 10, which may be a command signal line or an address signal line, extends from a register 16 to one end of a second transmission line 20 (which is a single conductor, but functions as separate segments or transmission lines 20a-g). Respective transmission lines 30a-h are coupled to spaced apart locations of the transmission lines 20(a-g). The transmission lines 30a-h each extend to an input terminal of respective memory devices 36a-h, which, in this case are DRAM devices.

A "hybrid tree" topology shown in FIG. 1B differs from the daisy chain topology of FIG. 1A in that the first transmission line 10 is coupled to the center of the second transmission line 20a rather than to one of its ends. In alternative embodiments of a hybrid tree topology, the first transmission line 10 may be coupled to locations of the second transmission lines 20(a-d) other than either one end or the center of the second transmission line 20. Like the daisy chain topology shown in FIG. 1A, respective transmission lines 30a-h are coupled to spaced apart locations of the transmission lines 20a-d and extend to input terminals of the respective memory devices 36a-h.

Still another hybrid tree topology shown in FIG. 1C uses two separate transmission lines 20a,b coupled to the transmission lines 30a-d, 30e-h. Transmission lines 20a and 20b are made up of transmission lines 20aa, 20ab, 20ac, 20ad, 20ba, 20bb, 20bc and 20bd respectively. The transmission lines 20a,b are, in turn, coupled to the first transmission line 10 through a third transmission line 40, which joins the first transmission line 10 at the center of the transmission line 40. Transmission line 40 is made up of transmission lines 44a and 44b. Transmission lines 44a and 44b are coupled to the transmission lines 20a,b at the ends of the transmission line 40 by respective transmission lines 44a,b.

The daisy chain and hybrid tree topologies shown in FIGS. 1A-1C can provide adequate performance at relatively slow speeds, but they provide less than optimum performance at higher operating speeds. In particular, signals coupled through the transmission line 20 (or transmission lines 20a,b in the case of the topology shown in FIG. 1C) reflect from the junctions with the transmission lines 30a-h as well as from the junction between each of the transmission lines 30a-h and its respective memory devices 36a-h, respectively. These reflections produce destructive and constructive interference at each of the junctions between the transmission line 20 and the transmission lines 30a-h that can seriously degrade signals coupled to the memory devices 36. The hybrid tree topologies shown in FIGS. 1B and 1C place the transmission lines 30a-h closer to the ends of the transmission line 20 compared to the daisy chain topology shown in FIG. 1A. Therefore, the hybrid tree topologies tend to provide better performance than the daisy chain topology. However, the hybrid tree topologies still provide less than optimum performance. Further, the hybrid tree topology shown in FIG. 1C also produces reflections from the junctions between the transmission lines 20a,b and the transmission lines 44a,b.

Although the signal reflection problems have been described in the context of registered memory modules, the same problem can exist in other types of memory modules. For example, in a memory hub module, signals are coupled from a memory hub in the module to each of several memory devices in the module. Also, in a buffered memory module, signals are coupled from respective buffers in the module to each of several memory devices in the module. Reflections produced in these types of memory modules can degrade performance in essentially the same manner as described above.

There is therefore a need for a connection topology for routing signals to memory devices in memory modules that can avoid signal degradation caused by reflections generated at the junctions between transmission lines and memory device terminals and between different transmission lines.

BRIEF SUMMARY OF THE INVENTION

A signal routing topology and method couples signals between an active memory component, such as a register, and a plurality of memory devices using transmission lines. The transmission lines are each connected at only its ends to either an input terminal of one of the memory devices or to an end of another of the transmission lines. The transmission lines form a symmetrical tree having several levels of hierarchy, with the transmission lines in the same level of hierarchy having the same length. The transmission lines are preferably impedance matched to pairs of transmission lines to which they are coupled. In the event the memory module contains an odd-numbered memory device, such as an error checking memory device, the odd-numbered memory device is coupled to the active memory component through a dedicated transmission line.

DETAILED DESCRIPTION

Figure 1A:
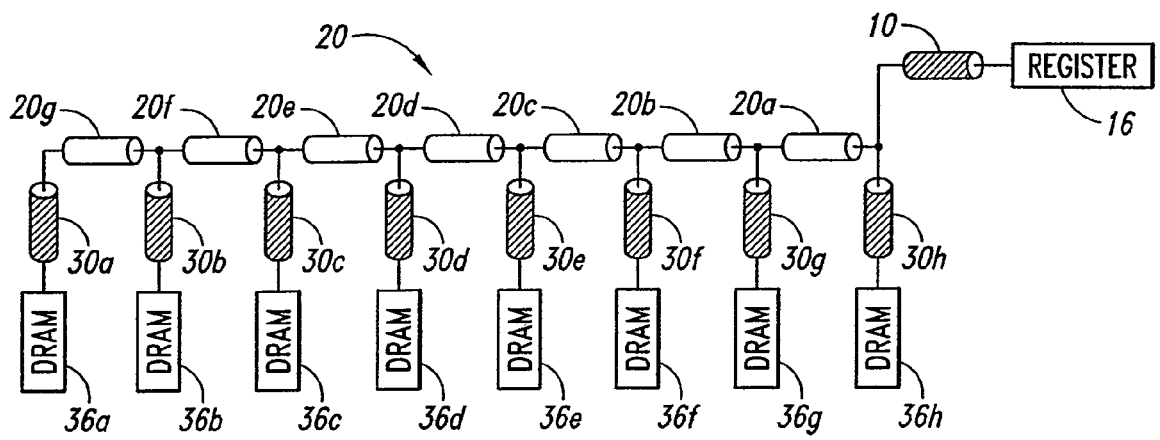
FIGS. 1A-1C are schematic diagrams showing topologies for routing signal lines from registers to memory devices in conventional registered memory modules.
Figure 1B:
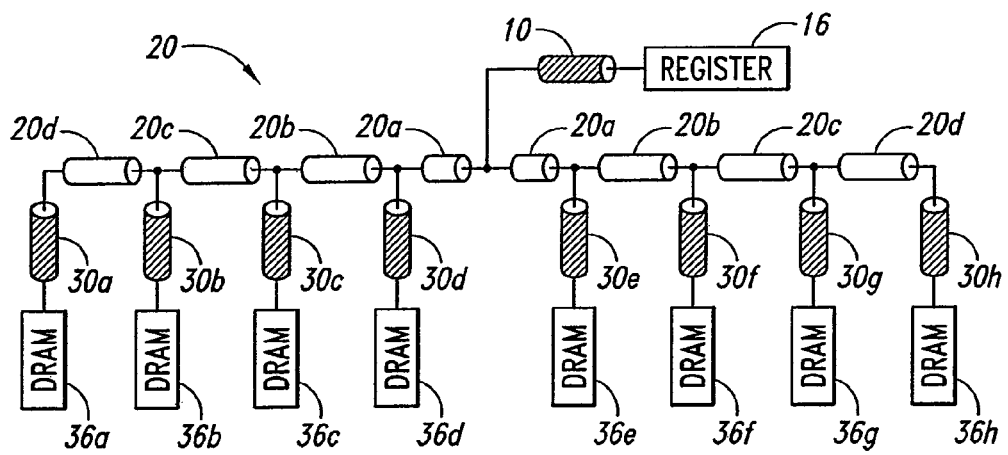
Figure 1C:
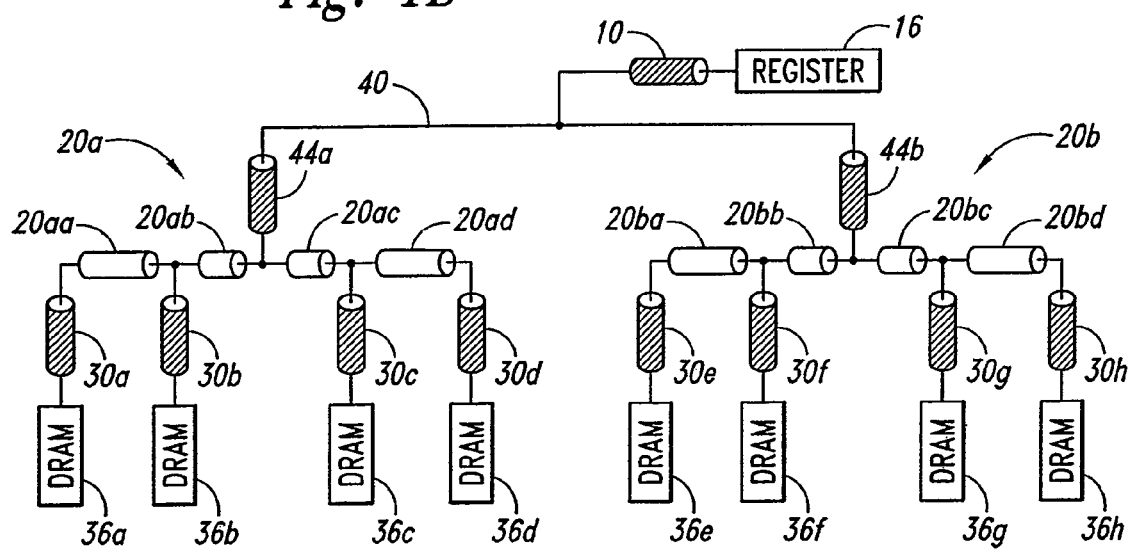
Figure 2:
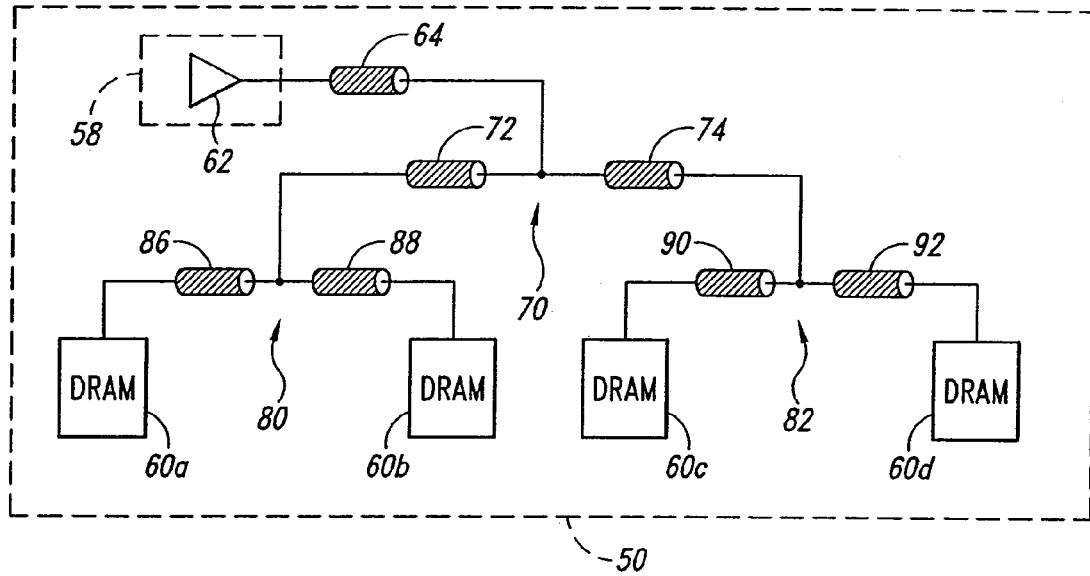
FIG. 2 is a schematic diagram showing one topology for routing transmission lines from a register to memory devices in a registered memory module according to one embodiment of the invention.

A topology for routing signals from a register to memory devices in a registered memory module according to one embodiment of the invention is shown in FIG. 2. The memory module 50 includes a register 58 and four dynamic random access memory ("DRAM") devices 60a-d. A large number of address and command lines are coupled from the register 58 to the DRAM devices 60a-d, although the signal lines for routing only one of these signals are shown in FIG. 2. The register 58 includes an output buffer 62 for each signal that is coupled to a first transmission line 64. The end of the first transmission line 64 is coupled to a first branch 70 that consists of two transmission lines 72, 74. The branch 70 is symmetrical in that both of the transmission lines 72, 74 have the same electrical and physical characteristics, particularly the same length. The ends of the transmission lines 72, 74 are coupled to a second pair of branches 80, 82, respectively. The branches 80, 82 are symmetrical internally and with each other as they are each formed by two transmission lines 86, 88 and 90, 92, respectively, having the same length. Although it is necessary that the transmission lines 86, 88 and 90, 92 of the respective branches 80, 82 all be of the same length, it is not necessary that the lengths of these transmission lines 86, 88, 90, 92 be equal to the lengths of the transmission lines 72, 74 in the branch 70. Finally, the end of each of the transmission lines 86, 88, 90, 92 is coupled to a respective one of the DRAMs 60a-d.

In operation, a signal is coupled through the first transmission line 64 to the transmission lines 72, 74 of the first branch 70. If these transmission lines are of the same impedance there is a mismatch and some of the energy reflected and some of the energy is passed. When the signal reaches the ends of the transmission lines 72, 74, it is again reflected from the junctions with the branches 80, 82, respectively. As a result, the signal is coupled to the branches 80, 82 with less magnitude. The reflections of the signal are then coupled back through the transmission lines 72, 74 to the junction of the transmission line 64. The reflected signals reach the junction with the transmission line 64 at the same time so that they appear as a single transmission line coupling to a higher impedance transmission line. This acts to reflect in phase increasing the voltage that eventually reaches the DRAMs. In a similar manner, the signal coupled to the branches 80, 82 have a relatively large magnitude at the ends of the transmission lines 86, 88 and 90, 92 because of their reflection from an input terminal of the DRAMs 60a-d. An open circuit reflects the signal resulting in an apparent doubling of the voltage. The signals reflected from the DRAMs 60a-d reach the junctions to the transmission lines 72, 74 at the same time because the lengths of the transmission lines 86, 88, 90, 92 are all identical. As a result, the impedance of the transmission lines 86, 88 and 90, 92 at their junction to the transmission lines 72, 74, respectively, appear to have a lower impedance coupling to a higher impedance resulting in an in phase reflection back to the DRAMs resulting in more signal at the DRAMs. The signals reflected through the transmission lines 86, 88 and 90, 92 are also coupled through the transmission lines 72, 74, respectively, of the first branch 70 where they reach the junction to the first transmission line 64 at the same time. Again another reflection back towards the DRAMs. The result of all these reflections is a stairstep of increasing voltage at the DRAMs.

Using a tree of transmission lines in which each branch is entirely symmetrical maximizes the magnitude of signals coupled to the DRAMs 60a-d and minimizes the magnitude of reflections reflected from the end of each transmission line. By coupling the DRAMs 60a-d only to the ends of the transmission lines, the destructive interference away from the ends of the transmission lines, which reduces signal amplitude, is avoided.

The symmetrical tree used in the memory module 50 of FIG. 2 includes branches with only two levels of hierarchy, namely the first branch 70 with a first level of hierarchy and the second branches 80, 82 with a second level of hierarchy. However, since each branch consists of two transmission lines each coupled to either a transmission line or a memory device at only its end, a memory module having $2^N$ of the memory devices will have N hierarchies of branches.

The reflections from the junctions between the transmission lines 86, 88 and 90, 92 and the transmission lines 72, 74, respectively, and from the junctions between the transmission lines 72, 74 and the transmission line 64 can be reduced even further by impedance matching the transmission lines. More specifically, as is well known in the art, each transmission line has a characteristic impedance. As is also well-known in the art, signals coupled through a transmission line are reflected from impedance discontinuities in the line. Therefore, such reflections can be avoided by avoiding impedance discontinuities. If the first transmission line 64 has an impedance of R (e.g., 17.5 ohms), the transmission lines 72, 74 in the first branch should each have an impedance of 2R (i.e., 35 ohms) since two resistors in parallel have an impedance of half the impedance of each resistor. Similarly, the transmission lines 86, 88, 90, 92 should each have an impedance of 4R (i.e., 70 ohms).

Although impedance matching of the transmission lines used in a symmetrical tree in accordance with the invention is desirable, it is not necessary. Furthermore, it may not be practical to provide impedance matching where the tree includes a large number of branch hierarchies because the practical range of impedance values that can be obtained is very limited. With commonly used conductive materials mounted on commonly used substrates, the transmission lines formed by the conductive materials become excessively wide at impedance values much less than 15 ohms, and they become excessively narrow at impedance values much larger than 80 ohms.

Figure 3:
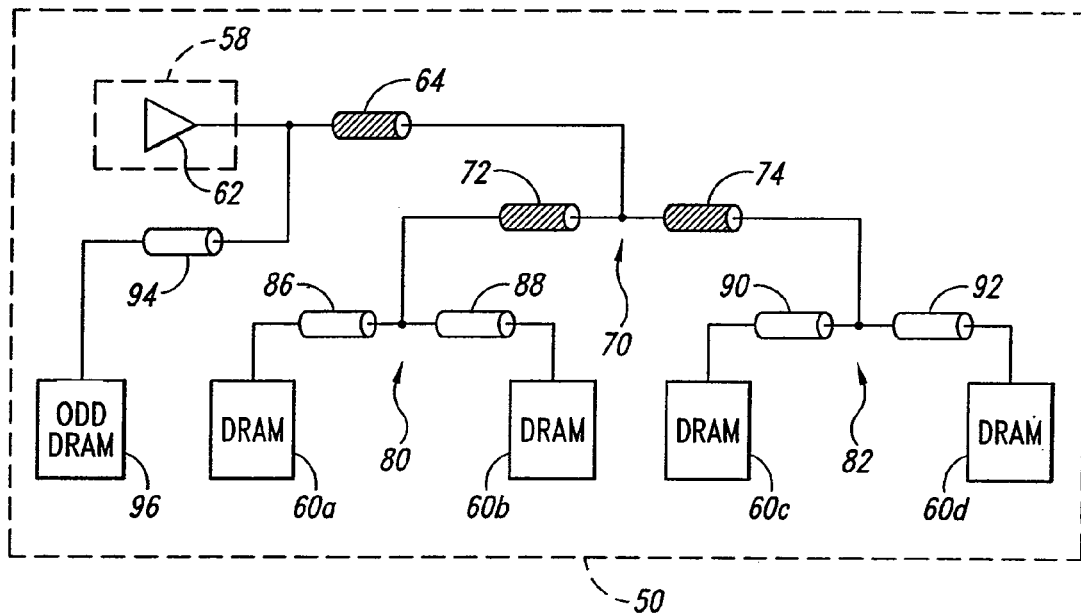
FIG. 3 is a schematic diagram showing a topology for routing transmission lines from a register to memory devices in a registered memory module having error checking capabilities according to another embodiment of the invention.

Data are commonly stored in a memory module using an even number of memory devices, and, more commonly, a number of memory devices equal to powers of two, i.e. 2, 4, 8, etc. However, some memory modules include error checking and/or correcting ("ECC") capabilities, which generally requires an additional memory device. The use of an odd number of memory devices, such as an ECC memory device, precludes coupling the memory devices through a symmetrical tree. However, the benefits of a symmetrical tree can be obtained using the topography shown in FIG. 3. FIG. 3 shows the same components of a memory module that are shown in FIG. 3 with the addition of an ECC DRAM 90. Therefore, in the interest of brevity, all of the component shown in FIG. 3 have been provided with the same reference numerals, and an explanation of their structure in operation will not be repeated. Although ECC capabilities can be obtained using the odd-numbered ECC DRAM 90 as shown in FIG. 3, ECC capabilities can also be obtained by simply using one of the DRAMs 60a-d to store ECC data.

The ECC DRAM 90 is coupled to the output of the buffer 62 through a dedicated transmission line 94 extending from a location at or near the buffer 62 to a terminal of the DRAM 90. By placing the junction between the transmission line 94 and the first transmission line 64 near the buffer 62, the magnitude of any reflections from the junction that are coupled through the tree is relatively small. The transmission line 94 preferably has a length that is equal to the combined length of the transmission lines between the buffer 62 and the DRAMs 60a-d so that a signal from the buffer 62 reaches the ECC DRAM 90 at the same time the signal reaches the DRAMs 60a-d. Also, any reflections from the DRAMs 60a-d reach the buffer 62 at the same time that any reflection from the ECC DRAM 90 reaches the buffer 62 so that the transmission lines to ECC DRAM 90 and DRAMs 60a-d can be considered to be in parallel. If the output impedance of buffer 62 is equal to this parallel impedance then signals reflected from the DRAMs 60a-d and 90 are not reflected from the output of the buffer 62.

Figure 4:
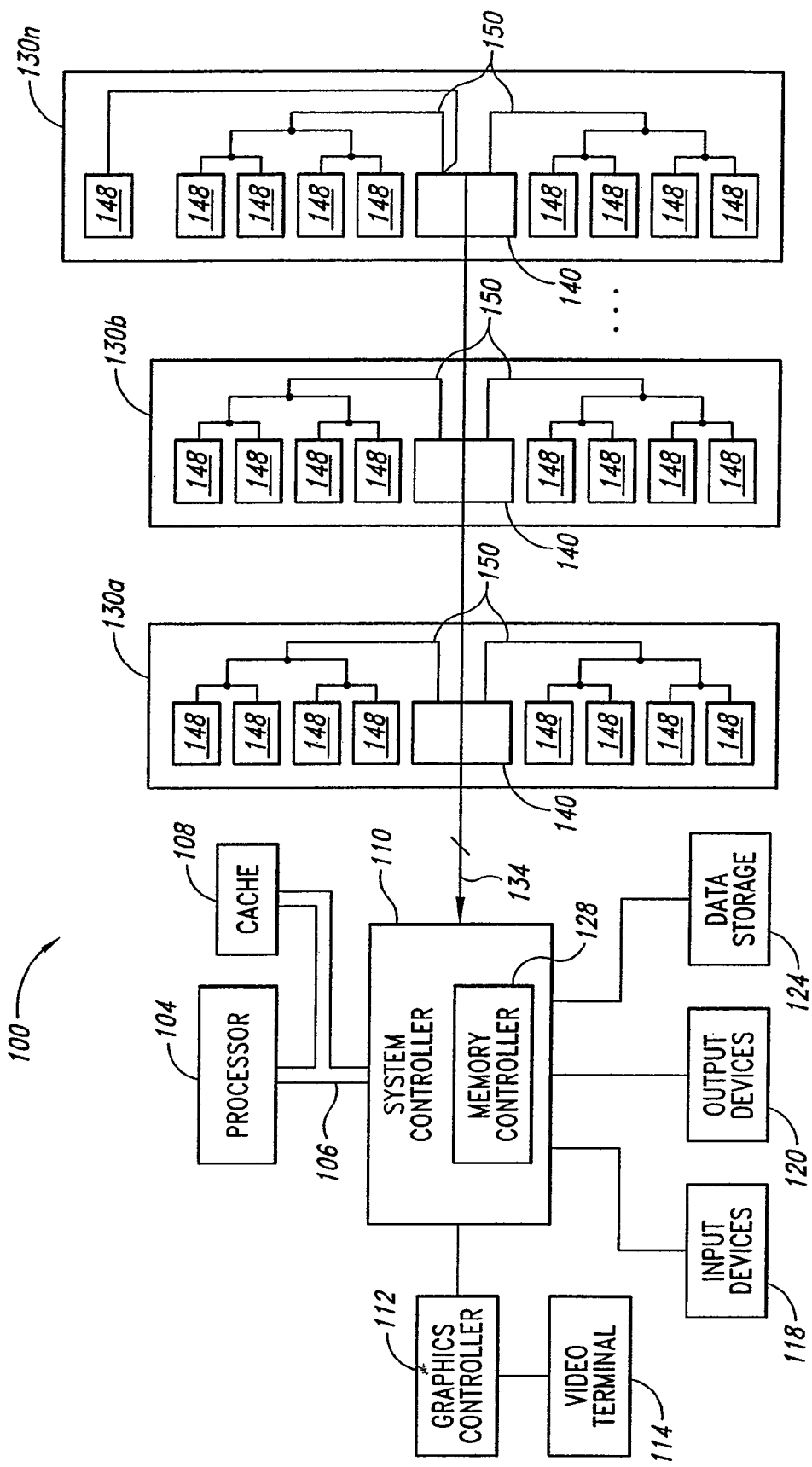
FIG. 4 is a block diagram of a computer system including registered memory modules in accordance with the present invention.

A computer system 100 according to one embodiment of the invention is shown in FIG. 4. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a bus bridge.

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory controller 128 that is coupled to several registered memory modules 130a,b...n, which serve as system memory for the computer system 100. The memory modules 130 are coupled to the memory controller 128 through a bus system 134. The memory modules 130 are shown coupled to the memory controller 128 in a multi-drop arrangement in which the single bus system 134 is coupled to all of the memory modules 130. However, it will be understood that other topologies may also be used.

Each of the memory modules 130 includes a register 140 for storing command and address signals as well as eight memory devices 148, which, in the example illustrated in FIG. 4, are synchronous dynamic random access memory ("SDRAM") devices. However, a fewer or greater number of memory devices 148 may be used, and memory devices other than SDRAM devices may also be used. The register 140 is coupled to each of the system memory devices 148 through symmetrical tree 150 in accordance with the present invention. An error checking and/or correcting memory device is included in the memory module 130n, in which the topography shown in FIG. 3 is preferably used.

From the foregoing it will be appreciated that, although specific embodiments of the invention have been described herein for purposes of illustration, various modifications may be made without deviating from the spirit and scope of the invention. For example, transmission line topologies according to the present invention can be used to couple signals to memory devices other than DRAMs and to memory devices from components other than registers. As previously mentioned, transmission line topologies according to the present invention can be used to route signals to memory devices from buffers or memory hubs, for example. Accordingly, the invention is not limited except as by the appended claims.

We claim:

1. A memory module, comprising:
   a plurality of memory devices;
   a component having a plurality of input terminals and a plurality of output terminals; and
   a symmetrical tree coupling each of several of the output terminals of the component to respective input terminals of the memory devices, the symmetrical tree comprising at least one branch, each branch including a pair of transmission lines coupled to each other at one end and to either a transmission line of another branch or one of the memory devices at another end, each of the transmission lines having a characteristic impedance, the transmission lines being arranged in a plurality of hierarchies with the transmission lines in the same hierarchy having substantially the same characteristic impedance.

2. The memory module of claim 1, further comprising an initial transmission line coupling the component to one of the branches of the symmetrical tree.

3. The memory module of claim 2 wherein the initial transmission line is coupled only to either the component or to one of the branches of the symmetrical tree.

4. The memory module of claim 1 wherein each of the memory devices comprise a respective dynamic random access memory device.

5. The memory module of claim 1 wherein the component comprises an active memory component.

6. The memory module of claim 5 wherein the active memory component comprises a memory hub.

7. The memory module of claim 5 wherein the active memory component comprises a buffer.

8. The memory module of claim 1 wherein the transmission lines in each of the branches are configured so that respective propagation times during which a signal may propagate through the symmetrical tree from the component to each of the memory devices is substantially the same.

9. A module, comprising:
a plurality of first devices;
a second device; and
a symmetrical tree coupled to the second device, the symmetrical tree comprising a plurality of branches each of which comprises a pair of transmission lines coupled to each other and to another transmission line at one end and to either a transmission line of another branch or one of the first devices at another end, the transmission lines being arranged in a plurality of hierarchies with the transmission lines in the same hierarchy having substantially the same length.

10. The module of claim 9, further comprising an initial transmission line having a first end coupled to the second device and a second end coupled to one of the branches of the symmetrical tree, the initial transmission line being coupled only to the second device and to the one of the branches.

11. The module of claim 9 wherein each of the first devices comprise a memory device, and wherein the second component comprises a memory hub.

12. The module of claim 9 wherein the second device comprises a buffer.

13. The module of claim 9, further comprising:
an third device; and
a dedicated transmission line coupling the second device to the third device.

14. The module of claim 13 wherein the dedicated transmission line is coupled only to the second device and the third device.

15. The module of claim 13 wherein the third device comprises a respective one of the second devices.

16. The memory module of claim 9 wherein both of the transmission lines in each of the hierarchies have the same length.

17. A module, comprising:
a plurality of first devices;
a second device; and
a symmetrical tree coupled to the second device, the symmetrical tree comprising at least one branch that comprises a pair of transmission lines coupled to each other and to another transmission line at one end and to either a transmission line of another branch or one of the first devices at another end, each of the transmission lines having a characteristic impedance, the transmission lines being arranged in a plurality of hierarchies with the transmission lines in the same hierarchy having substantially the same characteristic impedance.

18. The module of claim 17 wherein each of the first devices comprise a memory device, and wherein the second device comprises a memory hub.

19. The module of claim 17 wherein each of the first devices comprise a memory device, and wherein the second device comprises a register for storing address and command signals and outputting the stored address and command signals to the memory devices.

20. The module of claim 17 wherein the characteristic impedance of each transmission line in each branch is approximately twice the characteristic impedance of any transmission line that it is connected between the transmission line and the second device.

21. The module of claim 17 wherein the second device is connected to one of the branches of the symmetrical tree through an initial transmission line, the initial transmission line having approximately half the characteristic impedance of the transmission lines in the branch to which it is connected.

22. The module of claim 17 wherein both of the transmission lines in each branch have substantially the same length.

23. A module, comprising:
a plurality of first devices;
a second device; and
a symmetrical tree coupled to the second device, the symmetrical tree comprising a plurality of branches each of which comprises a pair of transmission lines coupled to each other and to another transmission line at one end and to either a transmission line of another branch or one of the first devices at another end, the transmission lines being arranged in a plurality of hierarchies with both of transmission lines in the same hierarchy being configured so that a time period during which a signal may propagate through each of the transmission lines is substantially the same for both transmission lines.

24. the module of claim 23 wherein the transmission lines are configured so that respective propagation times during which a signal may propagate from the second device to each of the first devices is substantially the same.

* * * * *

UNITED STATES PATENT AND TRADEMARK OFFICE
CERTIFICATE OF CORRECTION

PATENT NO. : 7,746,095 B2  Page 1 of 1
APPLICATION NO. : 12/480589
DATED : June 29, 2010
INVENTOR(S) : George E. Pax and Roy E. Greeff It is certified that error appears in the above-identified patent and that said Letters Patent is hereby corrected as shown below:

Column 3, line 1, "couples" should read --couple--.
Column 3, line 6, "its" should read --their--.
Column 3, line 67, "energy reflected" should read --energy is reflected--.
Column 4, line 13, "have" should read --has--.
Column 4, line 22, "appear" should read --appears--.
Column 4, line 36, "ands" should read --ends--.
Column 5, line 15, "requires" should read --require--.
Column 5, line 22, "component" should read --components--.
Column 6, Claim 4, line 66, "comprise" should read --comprises--.
Column 7, Claim 8, line 11, "is" should read --are--.
Column 7, Claim 11, line 30, "comprise" should read --comprises--.
Column 7, Claim 13, line 35, "an" should read --a--.
Column 8, Claim 18, line 10, "comprise" should read --comprises--.
Column 8, Claim 19, line 13, "comprise" should read --comprises--.
Column 8, Claim 24, line 45, "the module" should read --The module--.
Column 8, Claim 24, line 48, "is" should read --are--.

Signed and Sealed this
Twenty-third Day of August, 2011

David J. Kappos
*Director of the United States Patent and Trademark Office*